United States Patent
Perkins et al.

(10) Patent No.: US 9,600,621 B2
(45) Date of Patent: Mar. 21, 2017

(54) TECHNIQUES FOR OPTICAL PROCESSING ELEMENTS

(71) Applicant: Halliburton Energy Services, Inc., Houston, TX (US)

(72) Inventors: David L. Perkins, The Woodlands, TX (US); Robert Paul Freese, Pittsboro, NC (US); Christopher Michael Jones, Houston, TX (US); Richard Neal Gardner, Raleigh, NC (US)

(73) Assignee: Halliburton Energy Services, Inc., Houston, TX (US)

( * ) Notice: Subject to any disclaimer, the term of this patent is extended or adjusted under 35 U.S.C. 154(b) by 86 days.

(21) Appl. No.: 14/416,812

(22) PCT Filed: Mar. 4, 2014

(86) PCT No.: PCT/US2014/020265
§ 371 (c)(1),
(2) Date: Jan. 23, 2015

(87) PCT Pub. No.: WO2015/133998
PCT Pub. Date: Sep. 11, 2015

(65) Prior Publication Data
US 2016/0048627 A1 Feb. 18, 2016

(51) Int. Cl.
G06F 9/455 (2006.01)
G06F 11/22 (2006.01)
G06F 17/50 (2006.01)

(52) U.S. Cl.
CPC .......... G06F 17/5081 (2013.01); G06F 17/50 (2013.01); G06F 17/5072 (2013.01); Y02T 10/82 (2013.01)

(58) Field of Classification Search
USPC .......... 716/54, 132; 427/8, 10, 162
See application file for complete search history.

(56) References Cited

U.S. PATENT DOCUMENTS 6,542,876 B1 4/2003 Kikuchi et al.
7,138,156 B1* 11/2006 Myrick .................. G02B 5/285
359/359

(Continued)

FOREIGN PATENT DOCUMENTS

WO 2015133998 A1 9/2015

OTHER PUBLICATIONS

International Search Report and Written Opinion for PCT/US2014/020265 dated Dec. 12, 2014.

(Continued)

*Primary Examiner* — Brian Ngo
(74) *Attorney, Agent, or Firm* — McDermott Will & Emery LLP

(57) ABSTRACT

One disclosed method for designing an integrated computational element (ICE) core includes generating with a computer a plurality of predetermined ICE core designs having a plurality of thin film layers, wherein generating the plurality of predetermined ICE core designs includes iteratively varying a thickness of each thin film layer by applying coarse thickness increments to each thin film layer, calculating a transmission spectrum for each predetermined ICE core design, calculating a performance of each predetermined ICE core design based on one or more performance criteria, identifying one or more predictive ICE core designs based on the performance of each predetermined ICE core design, and optimizing the one or more predictive ICE core designs by iteratively varying the thickness of each thin film layer with fine thickness increments, wherein the one or more predictive ICE core designs are configured to detect a particular characteristic of interest.

25 Claims, 1 Drawing Sheet

(56) References Cited

U.S. PATENT DOCUMENTS

| | | |
|---|---|---|
| 7,688,517 B2 | 3/2010 | Omura et al. |
| 8,075,942 B1 | 12/2011 | Muray et al. |
| 2004/0027580 A1 | 2/2004 | Bosser et al. |
| 2013/0250405 A1* | 9/2013 | Kivel .................... G02B 5/281 |
| | | 359/359 |
| 2013/0284901 A1 | 10/2013 | Freese et al. |

OTHER PUBLICATIONS

Haibach et al., On-Line Reoptimization of Filter Designs for Multivariate Optical Elements, Applied Optics. vol. 42, No. 10, pp. 1833-1838, 2003.

* cited by examiner

TECHNIQUES FOR OPTICAL PROCESSING ELEMENTS

BACKGROUND

The present invention relates to optical processing elements and, more particularly, to improved techniques for the design of optical processing elements for use in optical computing devices.

Optical computing devices, also commonly referred to as "opticoanalytical devices," can be used to analyze and monitor a sample substance in real time. Such optical computing devices will often employ a light source that emits electromagnetic radiation that reflects from or is transmitted through the sample and optically interacts with an optical processing element to determine quantitative and/or qualitative values of one or more physical or chemical properties of the substance being analyzed. The optical processing element may be, for example, an integrated computational element core ("ICE core"). One type of an ICE core is an optical thin film interference device, also known as a multivariate optical element (MOE). Each ICE core can be designed to operate over a continuum of wavelengths in the electromagnetic spectrum from the vacuum-UV to infrared (IR) ranges, or any sub-set of that region. Electromagnetic radiation that optically interacts with the sample substance is changed and processed by the ICE core so as to be measured by a detector. The output of the detector can be correlated to a physical or chemical property of the substance being analyzed.

A traditional ICE core includes first and second pluralities of optical thin film layers consisting of various materials whose index of refraction and size (e.g., thickness) varies between each layer. An ICE core design refers to the substrate, number and thickness of the respective layers of the ICE core, and the complex refractive indices of the layers. The complex refractive index includes both the real and imaginary components of the refractive index. The layers are strategically deposited and sized so as to selectively pass predetermined fractions of electromagnetic radiation at different wavelengths configured to substantially mimic a regression vector corresponding to a particular physical or chemical property of interest of a substance of interest. Accordingly, an ICE core design will exhibit a transmission function that is weighted with respect to wavelength. As a result, the output light intensity from the ICE core conveyed to the detector may be related to the physical or chemical property of interest for the substance.

Historically, ICE cores have been designed by starting with an extremely large set of random designs (random number of layers with random thicknesses), for example 100,000+ designs. The performance of the various designs would then be determined by calculating one or more performance factors, such as, among others, the standard error of calibration (SEC) of each random ICE core design. Each of the 100,000+ designs would then be iteratively optimized by varying the thickness of each layer by small or minute increments to determine whether a positive or negative change in the performance factors (e.g., SEC) resulted. While this optimization process results in optimized ICE core designs, it requires immense computational capacity and time to undertake this task. Moreover, beginning the ICE core design process with a random design can produce several optimized ICE core designs that are substantially identical, thereby resulting in wasted calculation time for non-unique ICE core designs.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

Figure 1:
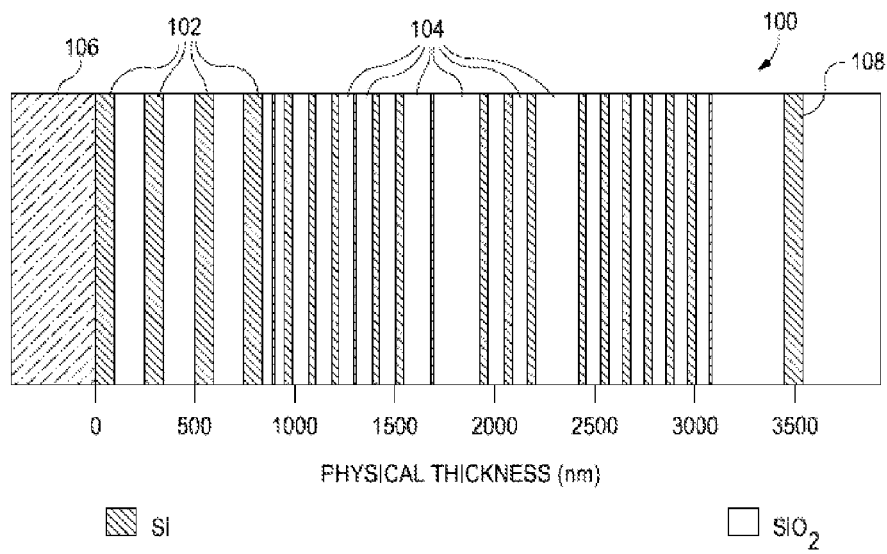
FIG. 1 illustrates an exemplary integrated computation element, according to one or more embodiments.

The present invention relates to optical processing elements and, more particularly, to improved techniques for the design of optical processing elements for use in optical computing devices.

The present disclosure expands the design palette for optical processing elements, such as integrated computational element cores ("ICE cores"), for use in optical computing devices. According to the improved methods described herein, the novel ICE core design processes may commence by generating a non-random set of predetermined ICE core designs that vary one from another by large or "coarse" layer thickness increments. The result is a large number of predetermined ICE core designs that cover the entire design space for particular design parameters, such as the total number of layers and upper and lower layer thickness limits. The spectral output and performance for each of predetermined ICE core design may then be calculated, and those designs that meet a performance threshold may be further optimized in order to obtain one or more predictive or viable ICE core designs. As will be appreciated, the methods described herein may prove advantageous in covering the entire design space for a given ICE core design. Moreover, the methods described herein may advantageously reduce the number of required total calculations in order to obtain a predictive ICE core design for a particular application.

The methods disclosed herein may prove advantageous in the design, evaluation, and fabrication of optical processing elements (e.g., ICE cores) that may be used in the oil and gas industry, such as for monitoring and detecting oil/gas-related substances (e.g., hydrocarbons, drilling fluids, completion fluids, treatment fluids, etc.). It will be appreciated, however, that the ICE cores designed using the methods disclosed herein may equally be used in other technology fields including, but not limited to, the food industry, the paint industry, the mining industry, the agricultural industry, the medical and pharmaceutical industries, the automotive industry, the cosmetics industry, water treatment facilities, and any other field where it may be desired to monitor substances in real time.

As used herein, the term "characteristic" or "characteristic of interest" refers to a chemical, mechanical, or physical property of a substance or a sample of the substance. The characteristic of a substance may include a quantitative or qualitative value of one or more chemical constituents or compounds present therein or any physical property associated therewith. Such chemical constituents and compounds may be referred to herein as "analytes." Illustrative characteristics of a substance that can be analyzed with the help of the optical processing elements described herein can include, for example, chemical composition (e.g., identity and concentration in total or of individual components), phase presence (e.g., gas, oil, water, etc.), impurity content, pH, alkalinity, viscosity, density, ionic strength, total dissolved solids, salt content (e.g., salinity), porosity, opacity, bacteria content, total hardness, transmittance, state of matter (solid, liquid, gas, emulsion, mixtures thereof, etc.), and the like.

As used herein, the term "electromagnetic radiation" refers to radio waves, microwave radiation, terahertz, infrared and near-infrared radiation, visible light, ultraviolet light, X-ray radiation and gamma ray radiation.

As used herein, the term "optically interact" or variations thereof refers to the reflection, transmission, scattering, diffraction, or absorption of electromagnetic radiation either on, through, or from an optical processing element (e.g., an integrated computational element) or a substance being analyzed with the help of the optical processing element. Accordingly, optically interacted light refers to electromagnetic radiation that has been reflected, transmitted, scattered, diffracted, or absorbed by, emitted, or re-radiated, for example, using an optical processing element, but may also apply to optical interaction with a substance.

As used herein, the term "optical computing device" refers to an optical device that is configured to receive an input of electromagnetic radiation associated with a substance and produce an output of electromagnetic radiation from an optical processing element arranged within or otherwise associated with the optical computing device. The optical processing element may be, for example, an integrated computational element (ICE core). The electromagnetic radiation that optically interacts with the optical processing element is changed so as to be readable by a detector, such that an output of the detector can be correlated to a particular characteristic of the substance being analyzed. The output of electromagnetic radiation from the optical processing element can be reflected, transmitted, and/or dispersed electromagnetic radiation. Whether the detector analyzes reflected, transmitted, or dispersed electromagnetic radiation may be dictated by the structural parameters of the optical computing device as well as other considerations known to those skilled in the art.

As indicated above, the present disclosure provides or otherwise describes improved methods for designing optical processing elements, such as ICE cores, for use in optical computing devices. In operation, an ICE core is capable of distinguishing electromagnetic radiation related to a characteristic of interest of a substance from electromagnetic radiation related to other components of the substance.

Referring to FIG. 1, illustrated is an ICE core 100. As illustrated, the ICE core 100 includes a plurality of alternating thin film layers shown as layers 102 and 104. The first layers 102 are made of a material that exhibits a high index of refraction, such as silicon (Si), and the second layers 104 are made of a material that exhibits a low index of refraction, such as quartz ($SiO_2$). Other examples of materials that might be used include, but are not limited to, niobia and niobium, germanium and germania, MgF, SiO, and other high and low index materials generally known in the art. The layers 102, 104 are strategically deposited on an optical substrate 106, such as BK-7 optical glass. In other embodiments, the substrate 106 may be another type of optical substrate, such as another optical glass, silica, sapphire, silicon, germanium, zinc selenide, zinc sulfide, or various plastics such as polycarbonate, polymethylmethacrylate (PMMA), polyvinylchloride (PVC), diamond, ceramics, combinations thereof, and the like.

At the opposite end (e.g., opposite the substrate 106 in FIG. 1), the ICE core 100 may include a layer 108 that is generally exposed to the environment of the device or installation. The number of layers 102, 104 and the thickness of each layer 102, 104 are determined from the spectral attributes acquired from a spectroscopic analysis of a characteristic of the substance being analyzed using a conventional spectroscopic instrument. The spectrum of interest of a given characteristic typically includes any number of different wavelengths.

It should be understood that the ICE core 100 depicted in FIG. 1 does not in fact represent any particular ICE core configured to detect a specific characteristic of a given substance, but is provided for purposes of illustration only. Consequently, the number of layers 102, 104 and their relative thicknesses, as shown in FIG. 1, bear no correlation to any particular substance or characteristic thereof. Nor are the layers 102, 104 and their relative thicknesses necessarily drawn to scale, and therefore should not be considered limiting of the present disclosure.

In some embodiments, the material of each layer 102, 104 can be doped or two or more materials can be combined in a manner to achieve the desired optical characteristic. Exemplary variations of the ICE core 100 may also include holographic optical elements, gratings, piezoelectric, light pipe, and/or acousto-optic elements, for example, that can create transmission, reflection, and/or absorptive properties of interest.

The multiple layers 102, 104 may exhibit different refractive indices. By properly selecting the materials of the layers 102, 104 and their relative thickness and spacing, the ICE core 100 will be configured to selectively transmit or reflect predetermined fractions of electromagnetic radiation at different wavelengths. Each wavelength is given a predetermined weighting or loading factor. The thickness and spacing of the layers 102, 104 may be determined using a variety of approximation methods from the spectrum of the characteristic or analyte of interest. These methods may include inverse Fourier transform (IFT) of the optical transmission spectrum and structuring the ICE core 100 as the physical representation of the IFT. The approximations convert the IFT into a structure based on known materials with constant refractive indices.

The weightings that the layers 102, 104 of the ICE core 100 apply at each wavelength are set to the regression weightings described with respect to a known equation, or data, or spectral signature. For instance, when electromagnetic radiation interacts with a substance, unique physical and chemical information about the substance is encoded in the electromagnetic radiation that is reflected from, transmitted through, or radiated from the substance. This information is often referred to as the spectral "fingerprint" of the substance. The ICE core 100 is configured to perform the dot product of the received electromagnetic radiation and the wavelength dependent transmission function of the ICE core 100. The wavelength dependent transmission function of the ICE core 100 is dependent on the substrate, the material refractive index of each layer, the number of layers 102, 104 and thickness of each layer 102, 104. As a result, the output light intensity of the ICE core 100 is related to the characteristic or analyte of interest.

As further explanation, accurately determining the regression vector of the characteristic of interest in the sample substance provides a means for an optical computing device to determine or otherwise calculate a concentration of said characteristic in the sample substance. The regression vector for each characteristic may be determined using standard procedures that will be familiar to one having ordinary skill in the art. For example, analyzing the spectrum of the sample substance may include determining a dot product of the regression vector for each characteristic of the sample substance being analyzed. As one of ordinary skill in art will recognize, a dot product of a vector is a scalar quantity (i.e., a real number). While the dot product value is believed to have no physical meaning by itself (e.g., it may return a positive or negative result of any magnitude), comparison of the dot product value of a sample substance with dot product values obtained for known reference standards and plotted in a calibration curve may allow the sample substance dot product value to be correlated with a concentration or value of a characteristic, thereby allowing unknown sample substances to be accurately analyzed.

To determine the dot product, one multiples the regression coefficient of the regression vector at a given wavelength by the spectral intensity at the same wavelength. This process is repeated for all wavelengths analyzed, and the products are summed over the entire wavelength range to yield the dot product. Those skilled in the art will recognize that two or more characteristics may be determined from a single spectrum of the sample substance by applying a corresponding regression vector for each characteristic.

In practice, it is possible to derive information from electromagnetic radiation interacting with a sample substance by, for example, separating the electromagnetic radiation from several samples into wavelength bands and performing a multiple linear regression of the band intensity against a characteristic of interest determined by another measurement technique for each sample substance. The measured characteristic may be expressed and modeled by multiple linear regression techniques that will be familiar to one having ordinary skill in the art. Specifically, if y is the measured value of the concentration or characteristic, y may be expressed as in Equation 1:

$$y = a_0 + a_1 w_1 + a_2 w_2 + a_3 w_3 + a_4 w_4 + \ldots \quad \text{Equation (1)}$$

where each 'a' is a constant determined by the regression analysis and each 'w' is the light intensity for each wavelength band. Depending on the circumstances, the estimate obtained from Equation (1) may be inaccurate, for example, due to the presence of other characteristics within the sample substance that may affect the intensity of the wavelength bands. A more accurate estimate may be obtained by expressing the electromagnetic radiation in terms of its principal components.

To obtain the principal components, spectroscopic data is collected for a variety of similar sample substances using the same type of electromagnetic radiation. For example, following exposure to each sample substance, the electromagnetic radiation may be collected and the spectral intensity at each wavelength may be measured for each sample substance. This data may then be pooled and subjected to a linear-algebraic process known as singular value decomposition (SVD) in order to determine the principal components. Use of SVD in principal component analysis will be well understood by one having ordinary skill in the art. Briefly, however, principal component analysis is a dimension reduction technique that takes 'm' spectra with 'n' independent variables and constructs a new set of eigenvectors that are linear combinations of the original variables. The eigenvectors may be considered a new set of plotting axes. The primary axis, termed the first principal component, is the vector that describes most of the data variability. Subsequent principal components describe successively less sample variability, until the higher order principal components essentially describe only spectral noise.

Typically, the principal components are determined as normalized vectors. Thus, each component of an electromagnetic radiation sample may be expressed as $x_n z_n$, where $x_n$ is a scalar multiplier and $z_n$ is the normalized component vector for the $n^{th}$ component. That is, $z_n$ is a vector in a multi-dimensional space where each wavelength is a dimension. Normalization determines values for a component at each wavelength so that the component maintains its shape and the length of the principal component vector is equal to one. Thus, each normalized component vector has a shape and a magnitude so that the components may be used as the basic building blocks of any electromagnetic radiation sample having those principal components. Accordingly, each electromagnetic radiation sample may be described by a combination of the normalized principal components multiplied by the appropriate scalar multipliers, as set forth in Equation (2):

$$x_1 z_1 + x_2 z_2 + \ldots + x_n z_n \quad \text{Equation (2)}$$

The scalar multipliers $x_n$ may be considered the "magnitudes" of the principal components in a given electromagnetic radiation sample when the principal components are understood to have a standardized magnitude as provided by normalization.

Because the principal components are orthogonal, they may be used in a relatively straightforward mathematical procedure to decompose an electromagnetic radiation sample into the component magnitudes, which may accurately describe the data in the original electromagnetic radiation sample. Since the original electromagnetic radiation sample may also be considered a vector in the multi-dimensional wavelength space, the dot product of the original signal vector with a principal component vector is the magnitude of the original signal in the direction of the normalized component vector. That is, it is the magnitude of the normalized principal component present in the original signal. This is analogous to breaking a vector in a three dimensional Cartesian space into its X, Y and Z components. The dot product of the three-dimensional vector with each axis vector, assuming each axis vector has a magnitude of 1, gives the magnitude of the three dimensional vector in each of the three directions. The dot product of the original signal and some other vector that is not perpendicular to the other three dimensions provides redundant data, since this magnitude is already contributed by two or more of the orthogonal axes.

Moreover, because the principal components are orthogonal to each other, the dot product of any principal component with any other principal component is zero. Physically, this means that the components do not spectrally interfere with each other. If data is altered to change the magnitude of one component in the original electromagnetic radiation signal, the other components remain unchanged. In the analogous Cartesian example, reduction of the X component of the three dimensional vector does not affect the magnitudes of the Y and Z components.

Principal component analysis provides the fewest orthogonal components that can accurately describe the data carried by the electromagnetic radiation samples. Thus, in a mathematical sense, the principal components are components of the original electromagnetic radiation that do not interfere with each other and that represent the most compact description of the spectral signal. Physically, each principal component is an electromagnetic radiation signal that forms a part of the original electromagnetic radiation signal. Each principal component has a shape over some wavelength range within the original wavelength range. Summing the principal components may produce the original signal, provided each component has the proper magnitude, whether positive or negative.

The principal components may comprise a compression of the information carried by the total light signal. In a physical sense, the shape and wavelength range of the principal components describe what information is in the total electromagnetic radiation signal, and the magnitude of each component describes how much of that information is present. If several electromagnetic radiation samples contain the same types of information, but in differing amounts, then a single set of principal components may be used to describe (except for noise) each electromagnetic radiation sample by applying appropriate magnitudes to the components. The principal components may be used to provide an estimate of the characteristic of the sample substance based upon the information carried by the electromagnetic radiation that has interacted with that sample substance. Differences observed in spectra of sample substances having varying quantities of an analyte or values of a characteristic may be described as differences in the magnitudes of the principal components. Thus, the concentration of the characteristic may be expressed by the principal components according to Equation (3) in the case where four principal components are used:

$$y = a_0 + a_1 x_1 + a_2 x_2 + a_3 x_3 + a_4 x_4 \quad \text{Equation (3)}$$

where 'y' is a concentration or value of a characteristic, each a is a constant determined by the regression analysis, and $x_1$, $x_2$, $x_3$ and $x_4$ are the first, second, third, and fourth principal component magnitudes, respectively. Equation (3) may be referred to as a regression vector. The regression vector may be used to provide an estimate for the concentration or value of the characteristic for an unknown sample.

Regression vector calculations may be performed by computer, based on spectrograph measurements of electromagnetic radiation by wavelength. The spectrograph system spreads the electromagnetic radiation into its spectrum and measures the spectral intensity at each wavelength over the wavelength range. Using Equation (3), the computer may read the intensity data and decompose the electromagnetic radiation sample into the principal component magnitudes $x_n$ by determining the dot product of the total signal with each component. The component magnitudes are then applied to the regression equation to determine a concentration or value of the characteristic.

To simplify the foregoing procedure, however, the regression vector may be converted to a form that is a function of wavelength so that only one dot product is determined. Each normalized principal component vector $z_n$ has a value over all or part of the total wavelength range. If each wavelength value of each component vector is multiplied by the regression constant and corresponding to the component vector, and if the resulting weighted principal components are summed by wavelength, the regression vector takes the form of Equation (4):

$$y = a_0 + b_1 u_1 + b_2 u_2 + \ldots + b_n u_n \quad \text{Equation (4)}$$

where $a_0$ is the first regression constant from Equation (3), $b_n$ is the sum of the multiple of each regression constant $a_n$ from Equation (3) and the value of its respective normalized regression vector at wavelength 'n', and $u_n$ is the intensity of the electromagnetic radiation at wavelength 'n'. Thus, the new constants define a vector in wavelength space that directly describes a concentration or characteristic of a sample substance. The regression vector in the form of Equation (4) represents the dot product of an electromagnetic radiation sample with this vector.

Normalization of the principal components provides the components with an arbitrary value for use during the regression analysis. Accordingly, it is very unlikely that the dot product value produced by the regression vector will be equal to the actual concentration or characteristic value of a sample substance being analyzed. The dot product result is, however, related (e.g., proportional or having a logarithmic or exponential relationship) to the concentration or characteristic value. As discussed above, the relationship may be determined by measuring one or more known calibration samples by conventional means and comparing the result to the dot product value of the regression vector. Thereafter, the dot product result can be compared to the value obtained from the calibration standards in order to determine the concentration or characteristic of an unknown sample being analyzed.

Before an ICE core, such as the ICE core 100 of FIG. 1, is physically fabricated for operation, 100,000+ random designs of the ICE core are typically generated using a computer-based software program or design suite. The design suite is stored on a computer-readable medium containing program instructions configured to be executed by one or more processors of a computer system. Ultimately, the design suite generates a theoretical ICE core design for each of the 100,000+ random designs, each being optimized and otherwise configured to detect a particular characteristic or analyte of interest of a substance for a given application.

To accomplish this, the design suite may commence the design process by generating a single random ICE core design that has a random number of layers and/or a random thickness for each layer. The performance of this random ICE core design may then be determined or otherwise found by calculating one or more performance factors or criteria associated with the random ICE core design in view of a characteristic or analyte of interest. Example performance criteria are known to those with knowledge in the art and include, but are not limited to, standard error of calibration (SEC), standard error of prediction (SEP), calibration sensitivity, transmission throughput, minimum prediction error, slope of the calibration curve, signal-to-noise ratio, environmental performance characteristics, predictive concentration range, linearity of prediction, thin-film stack thickness, individual layer thicknesses, mean transmission value, variability of the above performance criteria as a function of temperature or fabrication tolerance, corresponding to the particular characteristic or analyte of interest.

In at least one embodiment, the performance of the random ICE core design may be based solely on the SEC (i.e., chemometric predictability). As will be appreciated by those of skill in the art, the calculated SEC for an ICE core design is indicative of how good of a predictor the particular ICE core will be for the analyte of interest during operation. In such embodiments, the SEC can be calculated from a set of test data obtained through the transmission spectrum of the random ICE core design and comparing a predicted result of the characteristic or analyte of interest for each sample in the test set to that of a known value for the characteristic or analyte of interest. It should be noted, however, that the SEP may equally be calculated from the encoded ICE core regression vector, and SEC and SEP are often interchangeable and in many designs can be the same value.

The design suite may then proceed to iteratively modify each of the initial random ICE core designs in an attempt to improve one or more of the performance factors or criteria. Such modifications of each random ICE core design include varying layer optical thicknesses and/or adding or removing layers to generate a theoretical ICE core design that approaches one or more minimum criteria for predicting the characteristic of interest. Such iterations are typically fairly small or minute changes to each random ICE core design, such as altering the thickness of a single layer by as little as 0.01 nanometers (nm). The design suite repeats this process of optimizing each random ICE core design to produce tens of thousands of theoretical designs. In some cases, the design suite may end up producing 100,000+ theoretical ICE core designs from each of original random ICE core designs.

Once these optimized (theoretical) ICE core designs are generated, they may be sorted by the design suite based on the various performance criteria described above. In other words, the performance of each optimized (theoretical) ICE core design may be determined from transmission spectrum of the optimized (theoretical) ICE core designs for the characteristic of interest. Those theoretical ICE core designs that best meet the performance criteria are kept for further processing, while those theoretical ICE core designs that did not meet a minimum in performance criteria are removed from consideration. Those theoretical ICE core designs that meet the minimum performance criteria are considered "viable" ICE core designs.

Once a viable or desired ICE core design is ultimately selected for fabrication from the theoretical ICE core designs, the chosen ICE core design may then be loaded into a fabrication computer program configured to instruct an associated fabrication machine or module to physically create or manufacture the ICE core. The fabrication computer program may be configured to receive and/or download the specifications for the desired ICE core design, as generated by the design suite, and physically create a corresponding ICE core by methodically depositing the various layers of the ICE core to the specified layer thicknesses.

While the foregoing optimization routine and method for generating viable or predictive ICE core designs can be generally successful, there always remains the concern that the design space is not completely exhausted or thoroughly investigated (e.g., not all potentially viable designs are able to be considered). Moreover, as will be appreciated, iteratively generating several thousand ICE core designs with small or minute permutations requires an enormous amount of computational power and time. According to the present disclosure, instead of minimal or minute iterations being applied to a random ICE core design in order generate several theoretical ICE core designs, an initial set of predetermined designs with larger or coarse thickness iterations may instead be used to initiate the design process. As a result, significantly more theoretical ICE core designs will be generated, but will advantageously be generated over the entire design space, and with substantially reduced time to calculate. Performance factors or criteria may then be calculated for each predetermined design, and are used to identify the more viable or predictive designs to be further optimized.

Figure 2:
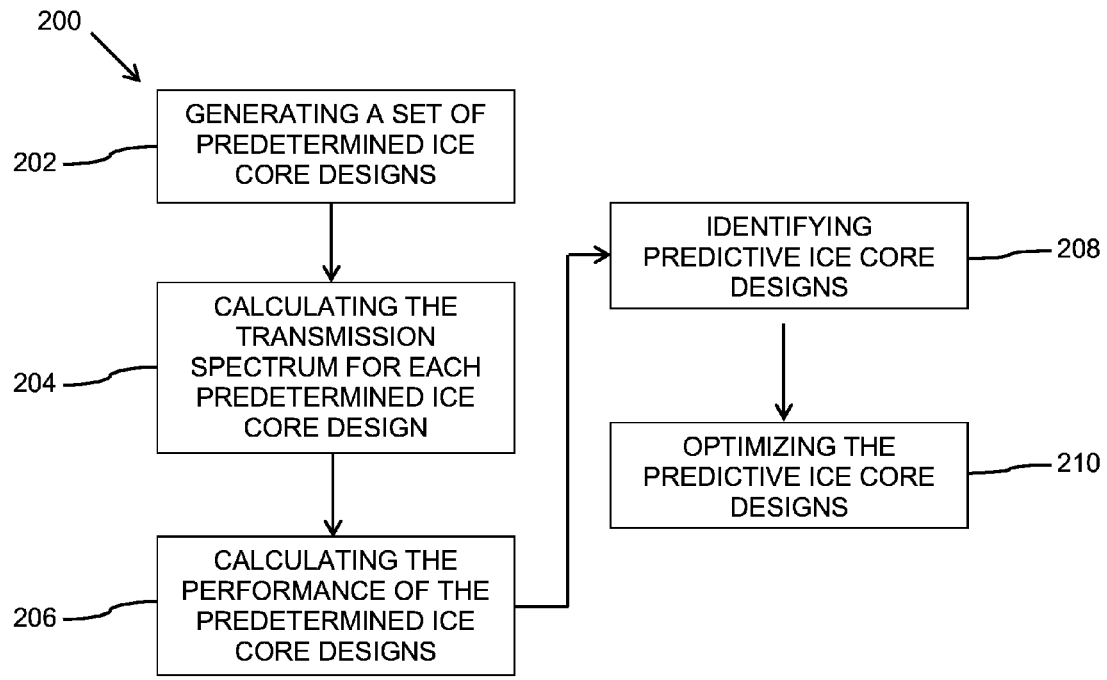
FIG. 2 illustrates a flowchart providing an exemplary method of designing an ICE core, according to one or more embodiments disclosed.

Referring now to FIG. 2, illustrated is a schematic flowchart that provides an exemplary and improved method 200 of designing an ICE core, according to one or more embodiments. The resulting predictive ICE core designs derived through the method 200 may be similar in some respects to the ICE core 100 of FIG. 1. As illustrated, the method 200 may first include generating a set of predetermined ICE core designs, as at 202. This may be done using the software-based design suite generally described above.

In generating the predetermined ICE core designs, the design suite may take into consideration, several design factors including the maximum number of layers to be included in the resulting ICE core design. For example, while it is theoretically possible to fabricate an ICE core with hundreds of layers, it may be infeasible or inefficient to do so. Accordingly, the design suite may be programmed with an upper limit parameter to the number of allowable layers employed in any one of the predetermined ICE core designs. Theoretically, the upper limit for the total number of layers may be any number, but would include at least two layers. For instance, the upper limit of total number of layers may be limited to two, five, ten, twenty, fifty, one hundred, two hundred, greater than two hundred, and any number therebetween. Accordingly, the design suite may be configured to limit the predetermined ICE core designs to any finite number of layers that is two or more, without departing from the scope of the disclosure. As will be appreciated, however, a smaller number of total layers may be more desirable since fewer possible combinations would be possible, thereby requiring fewer design calculations.

Another design factor that may be taken into consideration by the design suite in generating the predetermined ICE core designs is the minimum and maximum thickness for each layer and, consequently, the total stack thickness for the predetermined ICE core designs. Again, while it is theoretically possible to fabricate an ICE core having layers of any desired thickness, and thereby resulting in ICE cores having any total stack thickness, it may again be infeasible or inefficient to do so. As will be appreciated, limiting the overall thickness of the ICE core stack may be required for specific applications where a fabricated ICE core is required to operate in small areas or otherwise without exhibiting a large footprint. Accordingly, the design suite may further be programmed to limit each layer of the predetermined ICE core designs to a minimum and maximum layer thickness, thereby limiting the overall stack thickness of the predetermined ICE core designs.

Yet another design factor that may be taken into consideration by the design suite in generating the predetermined ICE core designs may be a coarse layer thickness increment to be applied to each layer. More particularly, and within the constraints of the aforementioned design factors, the predetermined ICE core designs may be generated by iteratively varying the thickness of each layer with "coarse" thickness increments. As will be appreciated, the number or range of coarse thickness increments may be dictated by the computational power and the number of possible combinations, where the range of coarse increments generally increases as the factorial of the number of layers.

In at least one embodiment, "coarse" increments may be quantified on the order of about 10× to about 200× greater than the later, fine-tuned optimizing calculations discussed below with reference to step 210. As will be appreciated, the coarse thickness increments will generally be smaller than the thickness of the typical thin film layer in the stack. Accordingly, in the event a predetermined ICE core design has an average film thickness of 1000 nm, for example, then the coarse increment values may be 3× or so smaller, and down to coarse increments that are approximately 10× to about 100× larger than the fine-tuned calculations. In the above example, therefore, the coarse increments may range from about 10 nm to about 300 nm. In general, a range of coarse layer thickness increments may be defined as about ten times greater than the fine-tuning optimization calculations of step 210 below, and up to a level that is less than or equal to the average thin film thickness of the design.

In one simplified exemplary embodiment, in accordance with step 202, the design suite may be programmed to generate a set of predetermined ICE core designs based on the following design factors: designs limited to two (2) thin film layers; each thin film layer of the designs has a minimum thickness of 300 nm and a maximum thickness of 900 nm; and the coarse thickness increment applied to each layer of each design is set at 100 nm. With the aforementioned design factors programmed therein, the design suite will be able to generate forty-nine (49) unique or different predetermined ICE core designs that cover the entire design space for the stated design factors. This set of predetermined ICE core designs may then be stored in a database or digital library for further use.

In another more complex exemplary embodiment, the design suite may be programmed to generate a set of predetermined ICE core designs based on the following design factors: designs limited to twelve (12) thin film layers; each thin film layer of the designs has a minimum thickness of 300 nm and a maximum thickness of 900 nm; and the coarse thickness increment applied to each layer of each design is set at 100 nm. With the aforementioned design factors programmed therein, the design suite will be able to generate 13.8 billion unique or different predetermined ICE core designs that would cover the entire design space for the stated design factors. Again, this set of predetermined ICE core designs may subsequently be stored in a database or digital library for further use.

With the set of predetermined ICE core designs generated and stored in an accessible database or digital library, the method 200 may proceed by calculating the transmission spectrum for each predetermined ICE core design, as at 204. More particularly, the complex refractive index for each layer, including both real and imaginary components, is known for each predetermined ICE core design. This may be ascertained based on the materials used in each layer and the optical constants associated with the machine that the ICE cores will ultimately be fabricated on. The design suite may query the database and otherwise access each predetermined ICE core design and, using the known complex refractive indices, may calculate the corresponding and predicted transmission spectrum or function for each predetermined design. The resulting spectra may then be stored in the database or digital library for future reference.

The performance of the predetermined ICE core designs may then be calculated, as at 206. This may be accomplished by employing the predicted transmission spectrum generated from each predetermined ICE core design and determining the relationship to the characteristic of interest. Such comparisons may be based on one or more of the performance criteria discussed above, such as SEC, SEP, calibration sensitivity, transmission throughput, minimum prediction error, slope of the calibration curve, signal-to-noise ratio, environmental performance characteristics, predictive concentration range, linearity of prediction, mean transmission value, variability of the above performance criteria as a function of temperature or fabrication tolerance, corresponding to the particular characteristic or analyte of interest.

In at least one embodiment, the comparison is based solely on the SEC (i.e., chemometric predictability) of the predetermined ICE core designs. The SEC may be calculated by taking the square root of the sum of squares between the known value for the characteristic of interest and the predicted value as derived from the predicted transmission spectrum of the particular predetermined ICE core design. This can be accomplished for each predetermined ICE core design by calculating its respective predictive transmission spectrum and applying that transmission spectrum to the known data set of the characteristic of interest.

Based on the calculated performance of each predetermined ICE core design, the method 200 may then include identifying one or more predetermined ICE core designs that are predictive of the characteristic or analyte of interest, as at 208. Whether a given predetermined ICE core design will be considered viable or "predictive" may be based on whether or not the calculated performance of the given predetermined ICE core design meets a particular performance threshold, as calculated or determined at 206. For example, in one embodiment, a given predetermined ICE core design must meet a minimum SEC (and/or SEP) value to be considered predictive or viable. Predetermined ICE core designs that exhibit an SEC value of 2.00 or less, for example, may be considered predictive and predetermined ICE core designs that exhibit an SEC value that is greater than 2.00 may be considered non-predictive. It will be appreciated, however, that the minimum SEC value that determines whether a particular ICE core design is considered predictive or non-predictive may be greater or less than 2.00, without departing from the scope of the disclosure.

Moreover, it will further be appreciated that any performance criteria mentioned herein may equally have a corresponding minimum performance threshold that the predetermined ICE core designs may be measured against to determine if one is predictive or not. The predetermined ICE core designs that are determined to be predictive based on the minimum performance threshold of one or more of the performance criteria may be set aside for further processing. Such predetermined ICE core designs may be referred to as "predictive" ICE core designs. However, the predetermined ICE core designs that are determined to be non-predictive may be removed from consideration either by an operator or by software instructions carried out by the design suite.

The method 200 may then include optimizing the predictive ICE core designs, as at 210. To accomplish this, the design suite may be configured to iterate each layer of the predictive ICE core designs with finer or smaller layer thickness increments until reaching predetermined or reasonable performance criteria, such as SEC. As will be appreciated, the smaller layer thickness increments applied to the predictive ICE core designs may be smaller than the coarse layer thickness increments described above to generate the set of predetermined ICE core designs. For instance, the smaller layer thickness increments may be about 1.00 nm, about 0.10 nm, about 0.01 nm, or any measurement falling therebetween.

In one example, for instance, a predictive ICE core design may have ten (10) layers, where a first layer of the design may exhibit a thickness of 100 nm. While initially considered to be a predictive ICE core design, the given design may not be optimal for fabrication. In order to optimize the predictive ICE core design, the thickness of the first layer may be altered or otherwise modified using 1.00 nm (or less) increments. Once an optimal or more predictive result is achieved for the first layer, the thickness of a second layer of the predictive ICE core design may similarly be iteratively modified using 1 nm (or less) increments until an optimal or more predictive result is achieved for the second layer. This process may be repeated for each layer of the predictive ICE core design. Those designs that result in the most optimal performance criteria may be selected for fabrication. Fabricating the ICE cores may proceed using various thin film deposition techniques, such as atomic layer deposition.

Those skilled in the art will readily appreciate the advantages that the above-described method 200 provides over current methods of designing ICE cores. By initially varying the thickness of each layer with coarse increments, all possible thin film designs within the constraints of the stated design factors are generated in the resulting set of predetermined ICE core designs. As a result, the entire design space for an ICE core that is intended for a particular application may be covered using this method 200. Moreover, unless the indices of refraction change, such as through alteration of the intended deposition or manufacturing process or changing the layer materials, steps 202 and 204 need only be undertaken once for any future desired ICE core design application. Upon receiving a new design application, such as manufacturing an ICE core useful in detecting methane in water, the database or library that is populated in steps 202 and 204 may be queried and steps 206, 208, and 210 may be repeated to determine which predetermined ICE core designs would be predictive of methane in water.

While calculation times using the method 200 may be dramatically reduced in comparison to conventional methods, the resulting calculation times may still be quite large, especially in generating the set of predetermine ICE core designs, as at 202. In some embodiments, however, such calculation times may be reduced by orders of magnitude by employing parallel processing techniques and software developed for the imaging industry, as generally known to those skilled in the art. Such parallel processing techniques may include employing multiple processors that work in parallel on subsets of the calculations. This may be accomplished using multi-core single computers, multiple networked computers, or multiple multi-core networked computers. As a result, calculation enhancements on the order of 100× to 10,000× may be possible.

The ICE cores designed using the presently disclosed embodiments may be useful in monitoring or otherwise detecting various analytes or characteristics of substances related to the oil and gas industry. For instance, the ICE cores may be used in conjunction with an optical computing device to monitor and detect hydrocarbons, drilling fluids, completion fluids, treatment fluids, etc. The optical computing devices may be used in a downhole environment, such as within a wellbore or a tubular extended within the wellbore, or at a surface location, such as a rig floor, a monitoring facility adjacent a rig floor, or a remote location where a sample may be delivered for processing.

Those skilled in the art will readily appreciate that the methods described herein, or large portions thereof, may be automated at some point such that a computerized system may be programmed to design, predict, and fabricate ICE cores that are more robust for fluctuating extreme environments. Computer hardware used to implement the various methods and algorithms described herein can include a processor configured to execute one or more sequences of instructions, programming stances, or code stored on a non-transitory, computer-readable medium. The processor can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), electrically erasable programmable read only memory (EEPROM)), registers, hard disks, removable disks, CD-ROMs, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor to perform the process steps described herein. One or more processors in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to a processor for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

Embodiments disclosed herein include:

A. A method for designing an integrated computational element (ICE) core that includes generating with a computer a plurality of predetermined ICE core designs having a plurality of thin film layers, wherein generating the plurality of predetermined ICE core designs includes iteratively varying a thickness of each thin film layer by applying coarse thickness increments to each thin film layer, calculating a transmission spectrum for each predetermined ICE core design, calculating a performance of each predetermined ICE core design based on one or more performance criteria, identifying one or more predictive ICE core designs based on the performance of each predetermined ICE core design, and optimizing the one or more predictive ICE core designs by iteratively varying the thickness of each thin film layer with fine thickness increments, wherein the one or more predictive ICE core designs are configured to detect a particular characteristic of interest.

B. A method for designing an integrated computational element (ICE) core that includes retrieving from a database a plurality of predetermined ICE core designs previously generated with a computer and each predetermined ICE core design having a plurality of thin film layers, wherein the plurality of predetermined ICE core designs were generated by iteratively varying a thickness of each thin film layer by applying coarse thickness increments to each thin film layer, calculating a transmission spectrum for each predetermined ICE core design, calculating a performance of each predetermined ICE core design based on one or more performance criteria, identifying one or more predictive ICE core designs based on the performance of each predetermined ICE core design, and optimizing the one or more predictive ICE core designs by iteratively varying the thickness of each thin film layer with fine thickness increments, wherein the one or more predictive ICE core designs are configured to detect a particular characteristic of interest.

C. A method for designing an integrated computational element (ICE) core that includes retrieving from a database a plurality of predetermined ICE core designs previously generated with a computer and each predetermined ICE core design having a plurality of thin film layers, wherein the plurality of predetermined ICE core designs were generated by iteratively varying a thickness of each thin film layer by applying coarse thickness increments to each thin film layer, retrieving from the database a transmission spectrum for each predetermined ICE core design, calculating a performance of each predetermined ICE core design based on one or more performance criteria, identifying one or more predictive ICE core designs based on the performance of each predetermined ICE core design, and optimizing the one or more predictive ICE core designs by iteratively varying the thickness of each thin film layer with fine thickness increments, wherein the one or more predictive ICE core designs are configured to detect a particular characteristic of interest.

Each of embodiments A, B, and C may have one or more of the following additional elements in any combination: Element 1: wherein generating with the computer the plurality of predetermined ICE core designs comprises limiting the plurality of thin film layers to a maximum number of thin film layers. Element 2: wherein generating with the computer the plurality of predetermined ICE core designs comprises limiting a thickness of each predetermined ICE core design to a maximum total stack thickness. Element 3: further comprising limiting each thin film layer of each predetermined ICE core design to a minimum thickness, and limiting each thin film layer of each predetermined ICE core design to a maximum thickness. Element 4: further comprising storing the set of predetermined ICE core designs and the transmission spectrum for each predetermined ICE core design in a database. Element 5: wherein calculating the performance of each predetermined ICE core design comprises comparing the transmission spectrum of each predetermined ICE core design to a known value for the characteristic of interest. Element 6: wherein the one or more performance criteria are selected from the group consisting of standard error of prediction, calibration sensitivity, transmission throughput, minimum prediction error, slope of the calibration curve, signal-to-noise ratio, environmental performance characteristics, predictive concentration range, linearity of prediction, mean transmission value, and variability of the above performance criteria as a function of temperature or fabrication tolerance. Element 7: wherein the one or more performance criteria is a standard error of calibration for each predetermined ICE core design. Element 8: wherein identifying the one or more predictive ICE core designs comprises identifying predetermined ICE core designs that meet a performance threshold for the one or more performance criteria. Element 9: wherein the fine thickness increments range from about 1 nm to about 0.01 nm and any thickness measurement falling therebetween. Element 10: further comprising removing predetermined ICE core designs from consideration based on poor performance criteria.

Element 11: wherein calculating the transmission spectrum for each predetermined ICE core design comprises applying new optical constants based on materials used for each thin film layer or a machine used to fabricate the ICE core. Element 12: wherein calculating the performance of each predetermined ICE core design comprises comparing the transmission spectrum of each predetermined ICE core design to a known value for the characteristic of interest. Element 13: The method of claim 12, wherein the one or more performance criteria is a standard error of calibration (SEC) for each predetermined ICE core design and identifying the one or more predictive ICE core designs comprises selecting predetermined ICE core designs that exhibit a SEC value less than or equal to a predetermined SEC value.

Element 14: wherein calculating the performance of each predetermined ICE core design comprises comparing the transmission spectrum of each predetermined ICE core design to a known value for the characteristic of interest. Element 15: further comprising selecting a predictive ICE core design from the one or more predictive ICE core designs, the predictive ICE core design being configured to detect a characteristic of interest, fabricating an ICE core based on the predictive ICE core design, and using the ICE core in conjunction with an optical computing device to monitor a substance for a concentration of the characteristic of interest.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

What is claimed is:

1. A method for designing an integrated computational element (ICE) core, comprising:
   generating with a computer a plurality of predetermined ICE core designs having a plurality of thin film layers, wherein generating the plurality of predetermined ICE core designs includes iteratively varying a thickness of each thin film layer by applying coarse thickness increments to each thin film layer;
   calculating a transmission spectrum for each predetermined ICE core design;
   calculating a performance of each predetermined ICE core design based on one or more performance criteria;
   identifying one or more predictive ICE core designs based on the performance of each predetermined ICE core design; and
   optimizing the one or more predictive ICE core designs by iteratively varying the thickness of each thin film layer with fine thickness increments, wherein the one or more predictive ICE core designs are configured to detect a particular characteristic of interest.

2. The method of claim 1, wherein generating with the computer the plurality of predetermined ICE core designs comprises limiting the plurality of thin film layers to a maximum number of thin film layers.

3. The method of claim 1, wherein generating with the computer the plurality of predetermined ICE core designs comprises limiting a thickness of each predetermined ICE core design to a maximum total stack thickness.

4. The method of claim 3, further comprising:
   limiting each thin film layer of each predetermined ICE core design to a minimum thickness; and
   limiting each thin film layer of each predetermined ICE core design to a maximum thickness.

5. The method of claim 1, further comprising storing the set of predetermined ICE core designs and the transmission spectrum for each predetermined ICE core design in a database.

6. The method of claim 1, wherein calculating the performance of each predetermined ICE core design comprises comparing the transmission spectrum of each predetermined ICE core design to a known value for the characteristic of interest.

7. The method of claim 1, wherein the one or more performance criteria are selected from the group consisting of standard error of prediction, calibration sensitivity, transmission throughput, minimum prediction error, slope of the calibration curve, signal-to-noise ratio, environmental performance characteristics, predictive concentration range, linearity of prediction, mean transmission value, and variability of the above performance criteria as a function of temperature or fabrication tolerance.

8. The method of claim 1, wherein the one or more performance criteria is a standard error of calibration for each predetermined ICE core design.

9. The method of claim 1, wherein identifying the one or more predictive ICE core designs comprises identifying predetermined ICE core designs that meet a performance threshold for the one or more performance criteria.

10. The method of claim 1, wherein the fine thickness increments range from about 1 nm to about 0.01 nm and any thickness measurement falling therebetween.

11. The method of claim 1, further comprising removing predetermined ICE core designs from consideration based on poor performance criteria.

12. The method of claim 1, further comprising:
   selecting a predictive ICE core design from the one or more predictive ICE core designs, the predictive ICE core design being configured to detect a characteristic of interest;
   fabricating an ICE core based on the predictive ICE core design; and
   using the ICE core in conjunction with an optical computing device to monitor a substance for a concentration of the characteristic of interest.

13. A method for designing an integrated computational element (ICE) core, comprising:
   retrieving from a database a plurality of predetermined ICE core designs previously generated with a computer and each predetermined ICE core design having a plurality of thin film layers, wherein the plurality of predetermined ICE core designs were generated by iteratively varying a thickness of each thin film layer by applying coarse thickness increments to each thin film layer;
   calculating a transmission spectrum for each predetermined ICE core design;
   calculating a performance of each predetermined ICE core design based on one or more performance criteria;
   identifying one or more predictive ICE core designs based on the performance of each predetermined ICE core design; and
   optimizing the one or more predictive ICE core designs by iteratively varying the thickness of each thin film layer with fine thickness increments, wherein the one or more predictive ICE core designs are configured to detect a particular characteristic of interest.

14. The method of claim 13, wherein calculating the transmission spectrum for each predetermined ICE core design comprises applying new optical constants based on materials used for each thin film layer or a machine used to fabricate the ICE core.

15. The method of claim 13, wherein calculating the performance of each predetermined ICE core design comprises comparing the transmission spectrum of each predetermined ICE core design to a known value for the characteristic of interest.

16. The method of claim 13, wherein the one or more performance criteria are selected from the group consisting of standard error of prediction, calibration sensitivity, transmission throughput, minimum prediction error, slope of the calibration curve, signal-to-noise ratio, environmental performance characteristics, predictive concentration range, linearity of prediction, mean transmission value, and variability of the above performance criteria as a function of temperature or fabrication tolerance.

17. The method of claim 13, wherein identifying the one or more predictive ICE core designs comprises identifying predetermined ICE core designs that meet a performance threshold for the one or more performance criteria.

18. The method of claim 13, wherein the one or more performance criteria is a standard error of calibration (SEC) for each predetermined ICE core design and identifying the one or more predictive ICE core designs comprises selecting predetermined ICE core designs that exhibit a SEC value less than or equal to a predetermined SEC value.

19. The method of claim 13, further comprising:
selecting a predictive ICE core design from the one or more predictive ICE core designs, the predictive ICE core design being configured to detect a characteristic of interest;
fabricating an ICE core based on the predictive ICE core design; and
using the ICE core in conjunction with an optical computing device to monitor a substance for a concentration of the characteristic of interest.

20. A method for designing an integrated computational element (ICE) core, comprising:
retrieving from a database a plurality of predetermined ICE core designs previously generated with a computer and each predetermined ICE core design having a plurality of thin film layers, wherein the plurality of predetermined ICE core designs were generated by iteratively varying a thickness of each thin film layer by applying coarse thickness increments to each thin film layer;
retrieving from the database a transmission spectrum for each predetermined ICE core design;
calculating a performance of each predetermined ICE core design based on one or more performance criteria;
identifying one or more predictive ICE core designs based on the performance of each predetermined ICE core design; and
optimizing the one or more predictive ICE core designs by iteratively varying the thickness of each thin film layer with fine thickness increments, wherein the one or more predictive ICE core designs are configured to detect a particular characteristic of interest.

21. The method of claim 20, wherein calculating the performance of each predetermined ICE core design comprises comparing the transmission spectrum of each predetermined ICE core design to a known value for the characteristic of interest.

22. The method of claim 21, wherein the one or more performance criteria are selected from the group consisting of standard error of prediction, calibration sensitivity, transmission throughput, minimum prediction error, slope of the calibration curve, signal-to-noise ratio, environmental performance characteristics, predictive concentration range, linearity of prediction, mean transmission value, and variability of the above performance criteria as a function of temperature or fabrication tolerance.

23. The method of claim 21, wherein identifying the one or more predictive ICE core designs comprises identifying predetermined ICE core designs that meet a performance threshold for the one or more performance criteria.

24. The method of claim 21, wherein the one or more performance criteria is a standard error of calibration (SEC) for each predetermined ICE core design and identifying the one or more predictive ICE core designs comprises selecting predetermined ICE core designs that exhibit a SEC value less than or equal to a predetermined SEC value.

25. The method of claim 21, further comprising:
selecting a predictive ICE core design from the one or more predictive ICE core designs, the predictive ICE core design being configured to detect a characteristic of interest;
fabricating an ICE core based on the predictive ICE core design; and
using the ICE core in conjunction with an optical computing device to monitor a substance for a concentration of the characteristic of interest.

* * * * *